United States Patent
Frank et al.

(10) Patent No.: US 7,117,464 B2
(45) Date of Patent: Oct. 3, 2006

(54) SYSTEM AND METHOD FOR EVALUATING SIGNAL COUPLING BETWEEN DIFFERENTIAL TRACES IN A PACKAGE DESIGN

(75) Inventors: Mark D. Frank, Longmont, CO (US); Jerimy Nelson, Fort Collins, CO (US); Peter Shaw Modauer, Wellington, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 88 days.

(21) Appl. No.: 10/368,837

(22) Filed: Feb. 18, 2003

(65) Prior Publication Data
US 2004/0163058 A1 Aug. 19, 2004

(51) Int. Cl.
*G06F 17/50* (2006.01)
(52) U.S. Cl. .............................. 716/5; 716/4
(58) Field of Classification Search .............. 716/1–18; 438/108, 109
See application file for complete search history.

(56) References Cited
U.S. PATENT DOCUMENTS

| | | | | |
|---|---|---|---|---|
| 5,581,475 A | * | 12/1996 | Majors | 716/10 |
| 5,831,867 A | * | 11/1998 | Aji et al. | 716/4 |
| 5,994,766 A | | 11/1999 | Shenoy et al. | |
| 5,999,714 A | * | 12/1999 | Conn et al. | 716/2 |
| 6,038,383 A | * | 3/2000 | Young et al. | 716/5 |
| 6,349,402 B1 | * | 2/2002 | Lin | 716/2 |
| 6,566,167 B1 | * | 5/2003 | Liew et al. | 438/108 |
| 6,581,196 B1 | * | 6/2003 | Eisenberg et al. | 716/5 |
| 6,732,345 B1 | * | 5/2004 | Kato | 716/11 |
| 6,829,754 B1 | | 12/2004 | Yu et al. | |
| 6,834,427 B1 | | 12/2004 | Cornelius et al. | |
| 2002/0097061 A1 | * | 7/2002 | He et al. | 324/762 |
| 2004/0015796 A1 | * | 1/2004 | Frank et al. | 716/5 |
| 2004/0163056 A1 | * | 8/2004 | Frank et al. | 716/5 |

* cited by examiner

*Primary Examiner*—Vuthe Siek
*Assistant Examiner*—Binh Tat (57) ABSTRACT

A method is provided for evaluating trace signal coupling in an electronic design (e.g., a package design). In the method, one or more trace signal coupling rules are formulated. One or more trace pairs designed to carry differential signals are then processed to determine whether the inter-trace spacing between the trace pairs violates the trace signal coupling rules. An indicator (e.g., a DRC and/or a report) is generated to identify violated trace signal coupling rules. Processing of the electronic design may be scoped according one or a group of signal nets, or one or a group of levels of the package design.

30 Claims, 9 Drawing Sheets

SYSTEM AND METHOD FOR EVALUATING SIGNAL COUPLING BETWEEN DIFFERENTIAL TRACES IN A PACKAGE DESIGN

RELATED APPLICATION

This application is related to the following commonly owned U.S. Patent applications, each of which is incorporated herein by reference: U.S. patent application Ser. No. 10/368,988, filed Feb. 19, 2003, titled "System And Method For Evaluating Vias Per Pad In A Package Design"; U.S. patent application Ser. No. 10/368,789, filed Feb. 19, 2003, titled "System And Method For Evaluating Power and Ground Vias In A Package Design"; U.S. patent application Ser. No. 10/368,776, filed Feb. 19, 2003, titled "System And Method For Evaluating Signal Coupling Between Vias In A Package Design"; U.S. patent application Ser. No. 10/368,758, filed Feb. 19, 2003, titled "System And Method For Evaluating Signal Deviations In A Package Design"; and U.S. patent application Ser. No. 10/368,778, filed Feb. 19, 2003, titled "System And Method For Evaluating Signal Trace Discontinuities In A Package Design".

BACKGROUND

Prior art computer aided design (CAD) software is known to include complimentary tool suites for designing and analyzing the package of a die, e.g., a microprocessor. A "package" is the physical interconnection between the die and, for example, a printed circuit board (PCB). A typical package has several interconnected layers between its top level (L1), which connects to the die, and its bottom level (L2), which connects to the PCB.

A package "design" is a hierarchical and symbolic digital model of the package circuit. Those skilled in the art appreciate that hardware description languages (HDLs) may be used to formulate this digital model. The digital model consists of linked design elements that simulate the package circuit. The design elements are for example digital representations of the transistors, resistors, logic gates, traces (i.e., intra-level conductors), capacitors, vias (i.e., inter-level connectors), and wire bonds that make up the simulated schematic circuit.

The design elements and interconnections are collated and defined in a design database, which is a textual representation of the package design. The design database may further describe the package design in terms of higher-level cells consisting of two or more design elements, and the connections between cells. Each "net" in the package design describes the linked conductors (e.g., traces of a level and vias between levels) that form a circuit between an input and an output of the package. The CAD software may automatically route traces within a given level of the package design; it may further automatically route traces in a level and between vias of the package design.

The design database is processed by the CAD software to perform circuit simulation. The CAD software is for example used to model a signal through the package and over a net (i.e., a "signal net"). Substrate laminate technologies and bond interconnections may also be evaluated through the CAD software.

One exemplary prior art CAD software is Advanced Package Designer (APD) from Cadence Design Systems, Inc., of San Jose, Calif. Such CAD software is known to include verification procedures and dynamic feedback that evaluate design accuracy against a set of physical and electrical design rules, or constraints. Physical design constraints help to ensure manufacturability; electrical design constraints help to ensure electrical specifications of the design. By way of example, this CAD software generates a Design Rule Check (DRC) indicating whether the design meets the various constraints. The prior art CAD software also provides a graphical user interface to view all or part of the package design in two dimensions, for example in a flat or perspective rendition, or with levels overlaid relative to one another.

Figure 1:
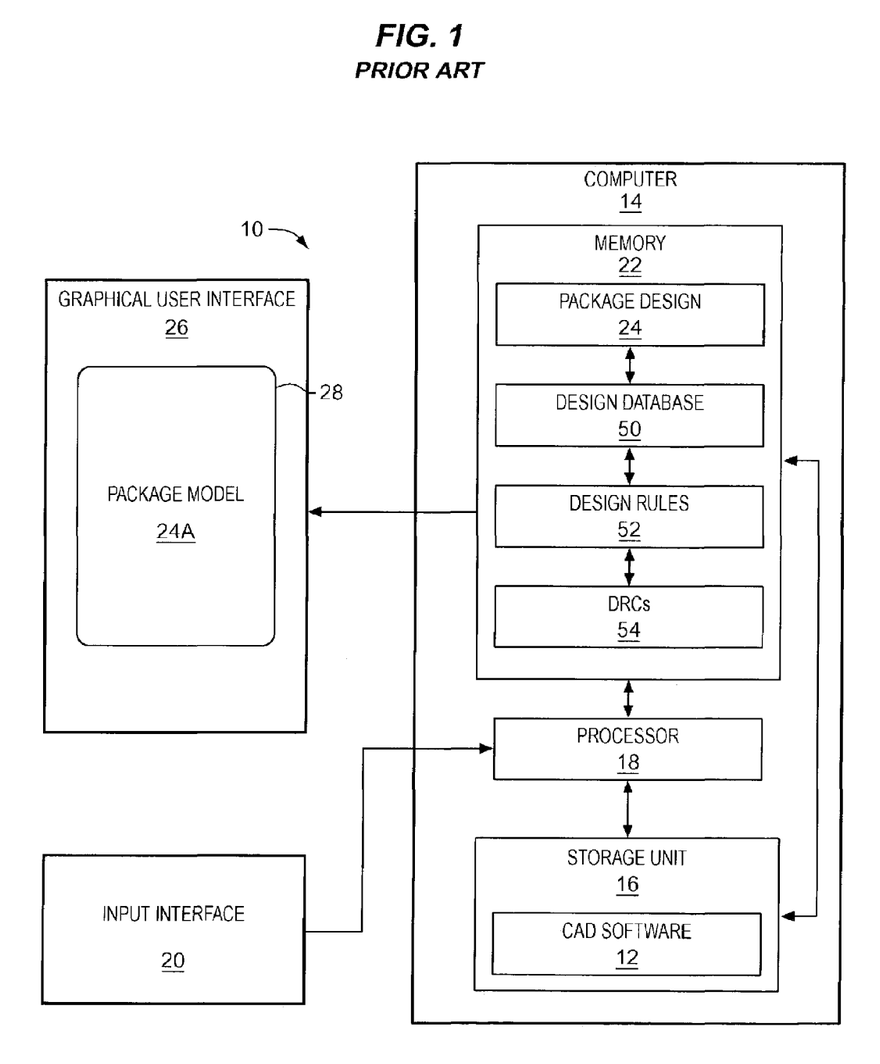
FIG. 1 shows a prior art system and CAD software for designing a package.

FIG. 1 illustrates one prior art system 10 for designing a package with prior art CAD software 12. CAD software 12 is stored within a computer 14, initially within a storage unit 16. A processor 18 of computer 14 operates CAD software in response to user inputs at an input interface 20 (e.g., a computer keyboard and mouse). As those skilled in the art appreciate, when initialized, CAD software 12 may also load into internal memory 22 of computer 14. A human designer at input interface 20 then controls CAD software 12, through processor 18, to create a package design 24, also stored within memory 22. The designer can command processor 18 and CAD software 12 to graphically show package design 24 at a graphical user interface 26 (e.g., a computer monitor) of system 10. Illustratively, package design 24 is graphically depicted on a display 28 of graphical user interface 26 as a five-level package model 24A shown in FIG. 2.

Figure 2:
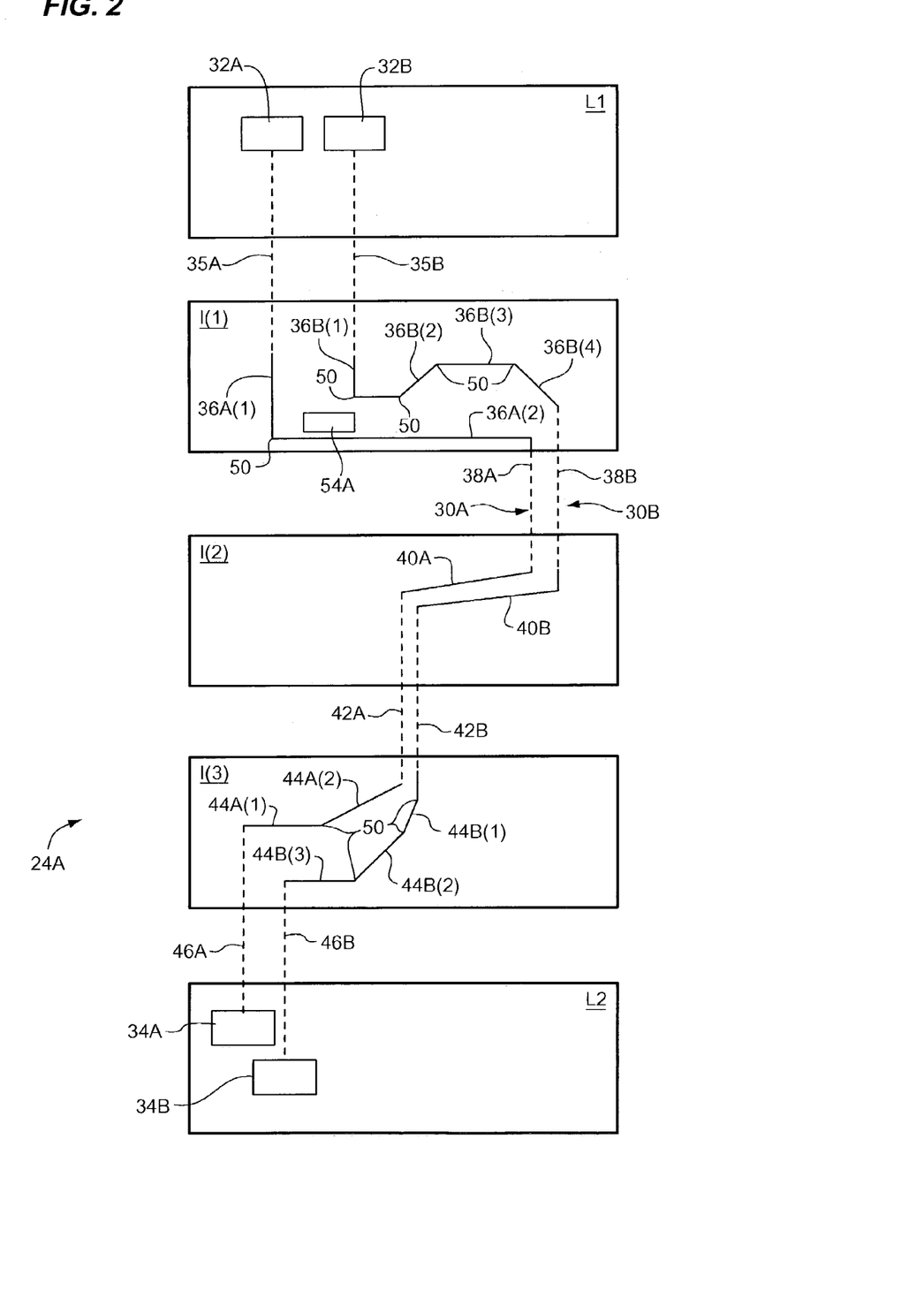
FIG. 2 shows one illustrative graphical model of the package design of FIG. 1.

FIG. 2 illustrates detail of graphical model 24A. L1 of model 24A couples with a die, and L2 of model 24A couples with a PCB. Levels I(1), I(2) and I(3) of model 24A represent intermediate levels of package design 24. Levels L1, I(1), I(2), I(3), L2 are shown as distinct elements and without proper or to-scale orientation for ease of illustration. An illustrative signal net 30A is shown from an input connector 32A to an output connector 34A of model 24A. Signal net 30A traverses design elements in the form of traces and vias between connectors 32A, 34A: via 35A from connector 32A of L1 to trace 36A of I(1); trace 36A within I(1) from via 35A to via 38A; via 38A from trace 36A of I(1) to trace 40A of I(2); trace 40A within I(2) from via 38A to via 42A; via 42A from trace 40A of I(2) to trace 44A of I(3); trace 44A within I(3) from via 42A to via 46A, which terminates at connector 34A of L2.

Another signal net 30B is shown from an input connector 32B to an output connector 34B of model 24A. Signal net 30B traverses design elements in the form of traces and vias between connectors 32B, 34B: via 35B from connector 32B of L1 to trace 36B of I(1); trace 36B within I(1) from via 35B to via 38B; via 38B from trace 36B of I(1) to trace 40B of I(2); trace 40B within I(2) from via 38B to via 42B; via 42B from trace 40B of I(2) to trace 44B of I(3); trace 44B within I(3) from via 42B to via 46B, which terminates at connector 34B of L2.

With further regard to FIG. 1, CAD software 12 is also operable to generate a design database 50. In one example, design database 50 textually defines signal nets 30A and 30B of FIG. 2: signal net 30A is defined by connectors 32A, 34A, traces 36A, 40A, 44A, and vias 35A, 38A, 42A, 46A; signal net 30B is defined by connectors 32B, 34B, traces 36B, 40B, 44B, and vias 35B, 38B, 42B, 46B. Design database 50 also includes parameters (often called a "netlist") to set physical package dimensions and to ensure that signal nets 30A and 30B have start and end points (i.e., connectors 32A, 34A for signal net 30A, and connectors 32B, 34B for signal net 30B). A designer can manipulate design database 50 to develop the desired package design 24.

CAD software 12 utilizes design rules 52 to generate one or more DRCs 54 in the event that a design element or signal net of package design 24 exceeds a manufacturing constraint or electrical specification. By way of example, design rules 52 may specify that a trace width of trace 36 is 20 μm, to ensure manufacturability. If a designer of package 24 implements trace 36A with 10 μm, for example, then CAD software 12 generates a DRC 54A, which may be graphically displayed on model 24A, as shown in FIG. 2. The user is thus made aware that a problem may exist with trace 36A.

Those skilled in the art appreciate that package design 24 often has more than the five levels illustrated in model 24A; however only five levels are shown in FIG. 2 for ease of illustration. For example, it is common that package design 24 include ground levels between each level with signal traces (I(1), I(2) and I(3); however these ground levels are not shown to simplify illustration. Those skilled in the art also appreciate that package design 24 also typically has many more signal nets and other design elements than illustrated signal nets 30A and 30B. For example, package design 24 typically includes many other traces and vias (not shown) within package model 24A.

Signal nets 30A, 30B are also illustrated close together with substantially similar form (e.g., traces 40A, 40B are substantially parallel) to illustrate that signal net pair 30A, 30B operates to transfer differential signals through package design 24. As those skilled in the art appreciate, differential signals provide benefits to electronic circuits, for example to provide enhanced signal discrimination, to reduce susceptibility to interference, and/or to accurately process bipolar signals. FIG. 2 also illustrates that traces of signal nets 30A, 30B sometimes deviate from one another within a given level. For example, in level I(1), trace 36B has four trace deviations 50 forming trace segments 36B(1)–36B(4), while trace 36A has one trace deviation 50 forming trace segments 36A(1) and 36A(2). Another deviation between signal nets 30A, 30B also clearly occurs in level I(3). In I(3), trace 44B has three trace deviations 50 forming trace segments 44B(1)–44B(3), while trace 44A has one trace deviation 50 forming trace segments 44A(1), 44A(2).

Figure 3:
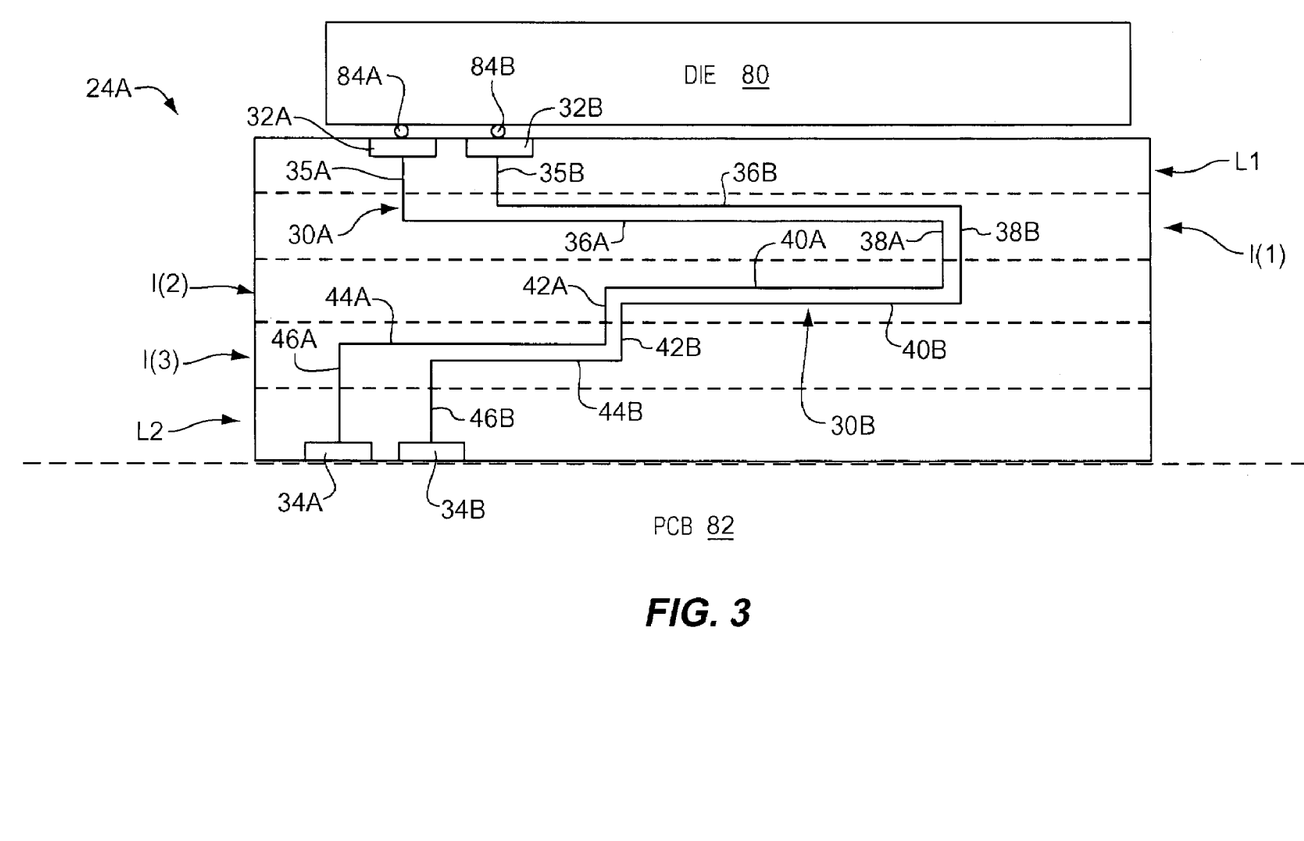
FIG. 3 illustrates the package design of FIG. 1 in a side view.

FIG. 3 illustrates package model 24A in a side view. FIG. 3 further illustrates how package design 24 connects between a die 80 and a PCB 82. Connector 32A is for example a pad that connects with a solder ball 84A of die 80; connector 34A is for example a pad that connects with signal wires of PCB 82. Similarly, connector 32B is for example a pad that connects with a solder ball 84B of die 80; connector 34B is for example a pad that connects with signal wires of PCB 82. As shown, signal nets 30A, 30B illustrate an exemplary pair of conductors suitable for transferring a differential signal from die 80 to PCB 82. Trace deviations 50 are not shown in FIG. 3 since they occur within a given layer.

The increased complexity of the modem die has correspondingly increased the complexity of the package design. An example of a complex die includes a Precision Architecture—Reduced Instruction Set Computer (PA-RISC) processor produced by Hewlett Packard Corporation, which has over one billion components. The package for the PA-RISC processor must maintain high signal integrity through its signal nets; this is especially true when the signal integrity involves differential signals. However the prior art CAD software does not simulate this signal integrity as required by the corresponding die. Accordingly, the package may be physically manufactured, at great expense, before the designer learns that the package is not suitable for operation with the die. More particularly, though the DRCs generated by the prior art CAD software may assist in manufacturability; they do not, however, warn the designer of signal net incompatibilities between the die and the package. In one example, prior art CAD software 12 does not evaluate the spacing or signal coupling between a pair of traces designed to carry differential signals of the package; if this spacing varies too much, the differential signal can decouple within the layer and induce common mode noise or other undesirable artifacts.

SUMMARY OF THE INVENTION

In one aspect, a method evaluates trace signal coupling in an electronic design. First, one or more trace signal coupling rules are formulated. Second, the electronic design is processed to determine whether trace signal coupling between trace pairs of the electronic design violate the trace signal coupling rules. Third, an indicator (e.g., a trace signal coupling DRC and/or report) is generated in association with the electronic design to identify violated trace signal coupling rules.

In another aspect, the step of processing includes the step of processing one signal net pair of the electronic design for violation of the trace signal coupling rules.

The electronic design may be a package design. In one aspect, the step of formulating thus includes the step of formulating one or more group trace signal coupling rules for a group of signal nets of the package design. The step of processing may further include the step of processing the group of signal nets to determine whether inter-trace spacings between differential signal net pairs of the group violate the group trace signal coupling rules.

In one aspect, the step of generating includes the step of generating at least one DRC for one or more violations of the group trace signal coupling rules.

In another aspect, the step of formulating one or more trace signal coupling rules includes defining an inter-trace spacing dimension (e.g., 120 microns) to ensure signal coupling between the trace pairs. In this aspect, the step of processing includes the step of determining whether the inter-trace spacing of the trace pairs differs from the inter-trace spacing dimension. A maximum inter-trace dimension may be set at 400 microns, for example, at which point decoupling occurs between traces carrying differential signals.

In one aspect, the step of formulating includes the step of defining a tolerance about the dimension.

In still another aspect, the step of formulating one or more trace signal coupling rules includes the step of defining a trace segment length difference (e.g., 600 microns), between trace pairs in a zone of decoupling, to ensure proper recoupling after the zone of decoupling. The step of processing, in this aspect, thus includes the step of determining whether trace segment lengths of the trace pairs, in the zone of decoupling, differs from the trace segment length difference. As before, the step of generating an indicator can further include the step of graphically depicting a DRC on a graphical user interface illustrating the electronic design.

In one aspect, trace signal coupling software is operable to determine a spacing between each trace pair carrying differential signals. The trace pair may be part of a single signal net, or part of a group of signal nets.

In another aspect, the step of formulating one or more trace signal coupling rules includes defining an inter-trace coupling dimension (e.g., 120 microns) to ensure coupling between trace pairs carrying differential signals. In this aspect, the step of processing includes the step of determining whether spacing between the trace pairs differs from the inter-trace coupling dimension.

In one aspect, the method includes formulating one or more trace signal coupling rules defining a maximum number (e.g., five) of times the trace pairs (with differing trace segment lengths) decouple and recouple. The step of processing thus includes determining whether a number of decoupling and recoupling for the trace pairs exceeds the maximum number.

In another aspect, a software product is provided. The software product has instructions, stored on computer-readable media, wherein the instructions, when executed by a computer, perform steps for evaluating trace signal coupling in an electronic design, including: determining inter-trace spacing between at least one trace pair of the electronic design; comparing the spacing to one or more trace signal coupling rules; and generating an indicator associated with the electronic design to identify violations of the trace signal coupling rules.

In one aspect, the software product further formulates one or more of the trace signal coupling rules.

In another aspect, the software product further determines whether one signal net in a group of signal nets has any trace pairs that violate the trace signal coupling rules.

In still another aspect, the software product further generates a report summarizing violations of the trace signal coupling rules.

In yet another aspect, the software product further compares the spacing to a desired inter-trace dimension set forth in the trace signal coupling rules.

In one aspect, the software product further compares the spacing to the desired inter-trace dimension with a tolerance defined in the trace signal coupling rules.

In another aspect, the software product further responds to designer inputs to scope the step of determining inter-trace spacing of the at least one trace pair.

In another aspect, the software product further compares the spacing against a trace signal coupling rule defining a dimension of about 120 microns.

In another aspect, the software product further compares the spacing against a trace signal coupling rule defining a decoupling dimension of about 400 microns.

In another aspect, the software product further compares the trace segment lengths of the trace pair, in a zone of decoupling, against a trace signal coupling rule defining a coupling terminated dimension of about 600 microns In another aspect, the software product further determines whether respective trace segment lengths of the trace pair within a zone of decoupling differs by a length exceeding a predefined trace segment length difference (e.g., 600 microns).

In another aspect, the software product further determines whether a number of times the trace pair is decoupled and recoupled exceeds a predefined number (e.g., 5), but only if respective trace segments of the trace pair differ in length.

Various ones of the methods, systems and products herein may provide certain advantages. A system configured with the trace signal coupling software can for example locate and evaluate the spacing between trace pairs in a package design, to compare the spacings relative to the trace signal coupling rules. This evaluation typically occurs for each segment of the traces within a given level. In one example, in order to maintain proper differential signal coupling for a pair of traces, the pair is evaluated for a desired separation dimension such as 120 μm. The evaluation may further assess separations between segments of the trace pair to isolate decoupling and recoupling of the differential signals. Decoupling occurs, for example, when trace segments separate by about 400 μm. When decoupled, the length of one trace relative to another trace is also evaluated, in one aspect, to determine whether one trace length is more than about 600 μm greater than the other (during a zone of decoupling, e.g., when trace segments of a signal net pair are separated by more than about 400 μm). The trace signal coupling software is thus operable to inform the designer that the trace pair is not within tolerance, for example by generating a DRC and/or violation report.

DETAILED DESCRIPTION OF THE DRAWINGS

Figure 4:
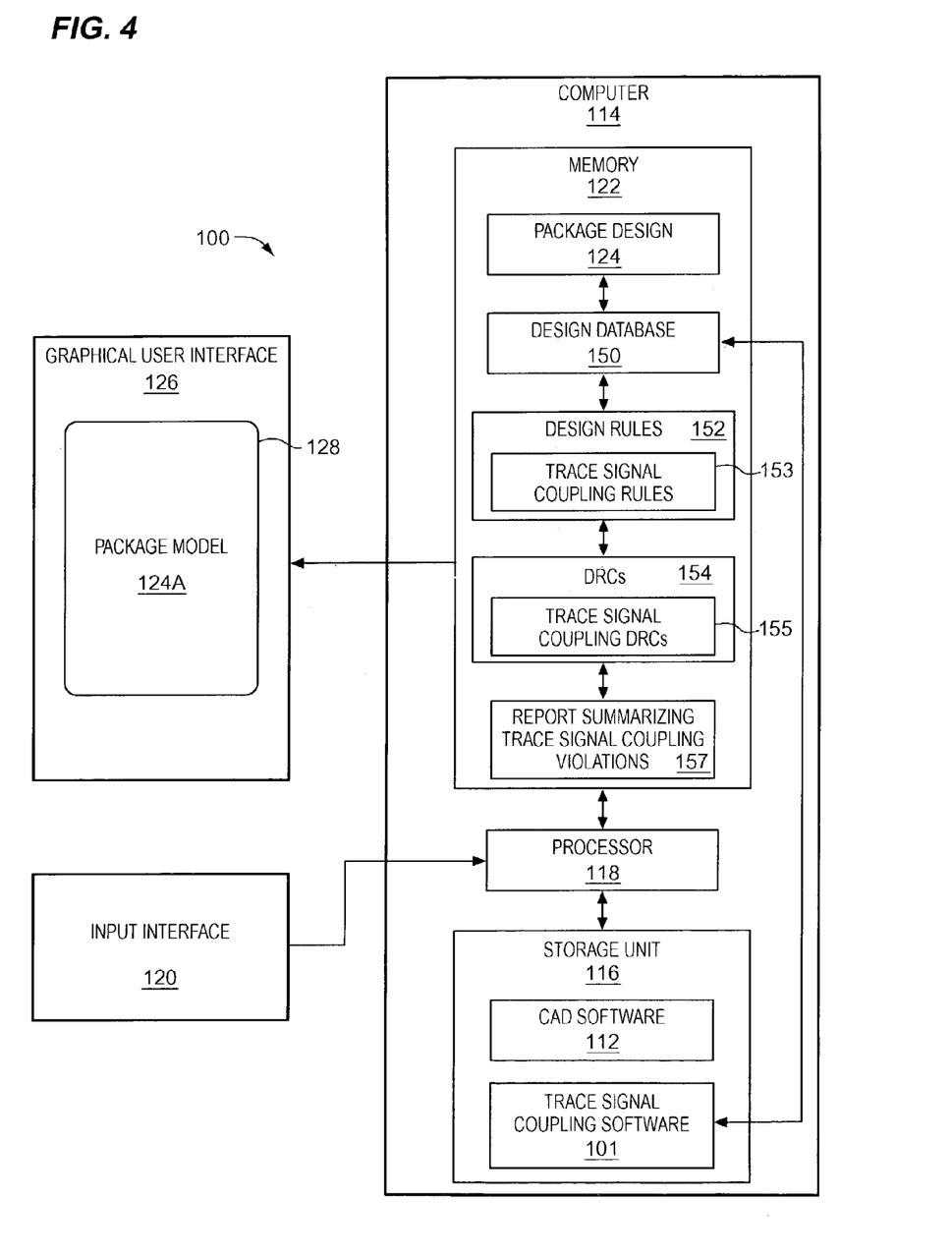
FIG. 4 shows one system for evaluating signal coupling between traces in a package design.
Figure 5:
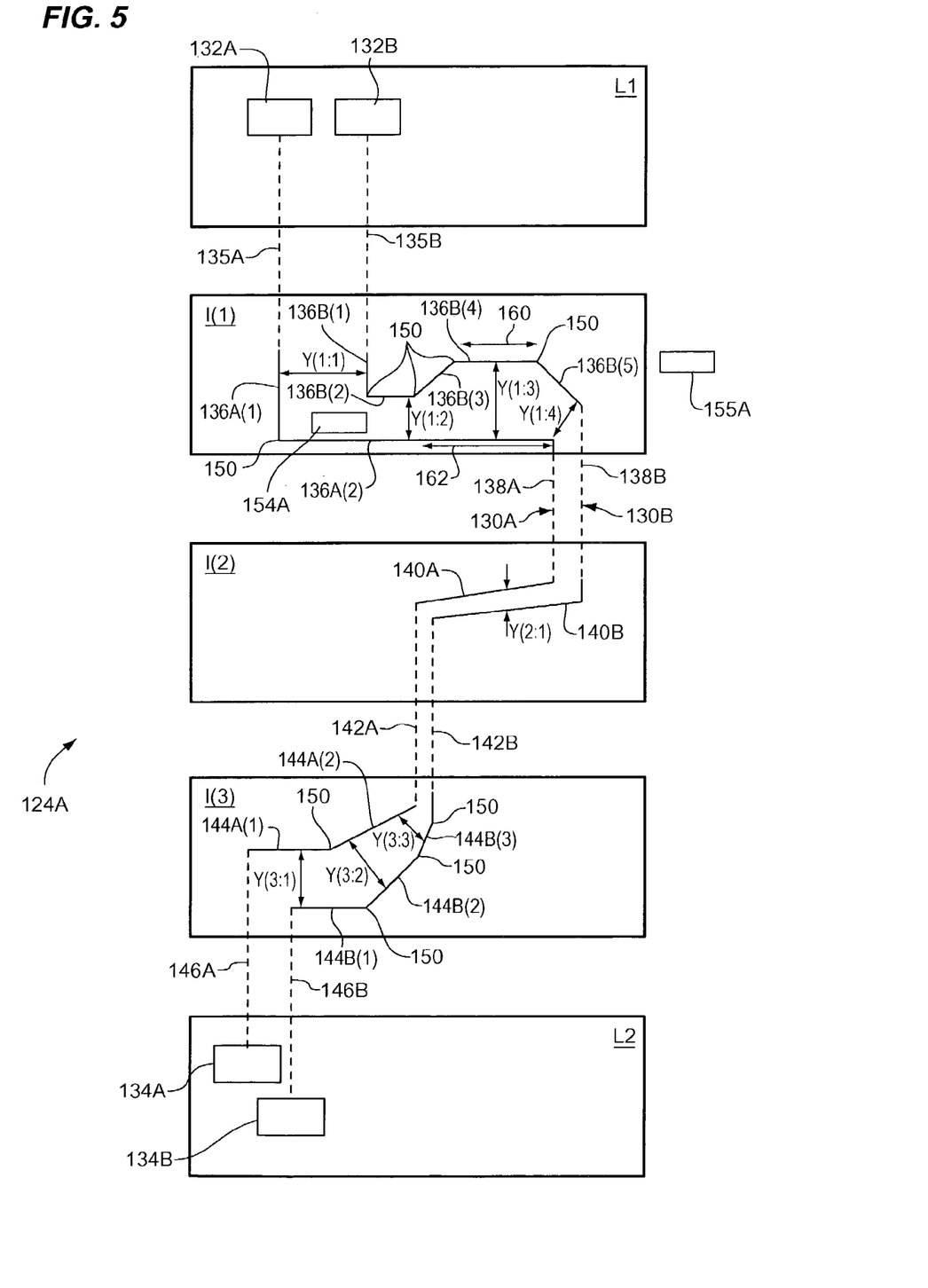
FIG. 5 illustrates one package design processed by the system of FIG. 4.

FIG. 4 shows one system 100 for designing and evaluating a package design utilizing CAD software 112 and trace signal coupling software 101. CAD software 112 and trace signal coupling software 101 are stored within a computer 114, initially within a storage unit 116. A processor 118 of computer 114 operates CAD software 112 and trace signal coupling software 101 in response to user inputs at an input interface 120 (e.g., a computer keyboard and mouse). When initialized, CAD software 112 and trace signal coupling software 101 may load into internal memory 122 of computer 114 as sets of instructions. A human designer at input interface 120 may then control CAD software 112 and trace signal coupling software 101, through processor 118, to create a package design 124, also stored within memory 122. The designer can command processor 118 and CAD software 112 to graphically show package design 124 in one or more dimensions at a graphical user interface 126 (e.g., a computer monitor) of system 100. Illustratively, package design 124 is graphically depicted on a display 128 of graphical user interface 126 as a five-level package model 124A, shown and described in connection with FIG. 5. In FIG. 5, L1 of model 124A couples with a die, and L2 of model 124A couples with a PCB. Levels I(1), I(2) and (3) of model 124A represent intermediate levels of package design 124. Levels L1, I(1), I(2), I(3), L2 are shown as distinct elements and without proper or to-scale orientations for ease of illustration.

An illustrative signal net 130A is shown in FIG. 5 from an input connector 132A to an output connector 134A of model 124A. Signal net 130A traverses design elements in the form of traces and vias between connectors 132A, 134A: via 135A from connector 132A of L1 to trace 136A of I(1); trace 136A within I(1) from via 135A to via 138A; via 138A from trace 136A of I(1) to trace 140A of I(2); trace 140A within I(2) from via 138A to via 142A; via 142A from trace 140A of I(2) to trace 144A of I(3); trace 144A within I(3) from via 142A to via 146A, which terminates at connector 134A of L2.

Another illustrative signal net 130B is shown in FIG. 5 from an input connector 132B to an output connector 134B of model 124A. Signal net 130B traverses design elements in the form of traces and vias between connectors 132B, 134B: via 135B from connector 132B of L1 to trace 136B of I(1); trace 136B within I(1) from via 135B to via 138B; via 138B from trace 136B of I(1) to trace 140B of I(2); trace 140B within I(2) from via 138B to via 142B; via 142B from trace 140B of I(2) to trace 144B of I(3); trace 144B within I(3) from via 142B to via 146B, which terminates at connector 134B of L2.

Signal nets 134A, 130B have trace deviations 150, as shown. In level I(1), trace 136B has four trace deviations 150 forming trace segments 136B(1)–136B(5), while trace 136A has one trace deviation 150 forming trace segments 136A(1) and 136A(2). Another deviation between signal nets 134A, 130B is also illustratively shown in level I(3). In I(3), trace 144B has three trace deviations 150 forming trace segments 144B(1)–144B(3), while trace 144A has one trace deviation 150 forming trace segments 144A(1), 144A(2).

FIG. 5 also illustrates the spacing Y between trace pairs (and particularly trace segments) in any given level. Y(1:1)–Y(1:3) illustrate the spacing between traces 136A, 136B carrying differential signals within level I(1). Illustratively, Y(1:3) represents a spacing between trace segment 136B(4) and trace segment 136A(2) that decouples the differential signals, for example a spacing that is greater than 400 μm. Y(1:1), Y(1:2) and Y(1:3), on the other hand, respectively represent a spacing between traces 136A, 136B that maintains coupling between the differential signals, for example a spacing that is less than 400 μm (and preferably less than about 120 μm). Y(2:1) represents the spacing between traces 140A, 140B carrying differential signals within level I(2). Illustratively, the spacing of Y(2:1) is shown to be sufficient (e.g., 120 μm) to maintain coupling between the differential signals. Y(3:1)–Y(3:3) illustrate the spacing between traces 144A, 144B carrying differential signals within level I(3). Illustratively, Y(3:1) represents a spacing between traces 144A, 144B that decouples the differential signals, for example a spacing that is greater than 400 μm. Y(3:3) represents. a spacing between traces 144A, 144B that maintains coupling between the differential signals, for example a spacing that is less than 400 μm. Y(3:2) has a variable spacing between trace segments 144A(2) and 144B(3) that expands, toward trace segments 144A(1) and 144B(1), causing decoupling between differential signals before reaching Y(3:1).

During a zone of decoupling, for example when traces 136A, 136B are separated by Y(1:3), it is relevant in accord with one embodiment hereof to also evaluate respective trace lengths between the signal net pair. For example, trace segment 136B(4) has a trace length 160; each other trace segment has its own trace length. If for example Y(1:2) and Y(1:4) exceed 400 μm, then decoupling occurs along the entire length 162 of trace segment 136A(2). The physical trace length of trace segments 136B(3)–136B(5) are then summed and compared to length 162 to compare trace segment lengths during the zone of decoupling, as described in more detail below with respect to FIG. 6.

With further regard to FIG. 4, CAD software 112 is also operable to generate a design database 150. In one example, design database 150 textually defines signal net 134A, including connectors 132A, 134A, traces 136A, 140A, 144A, and vias 135A, 138A, 142A, 146A. Design database also textually defines signal net 130B, including connectors 132B, 134B, traces 136B, 140B, 144B, and vias 135B, 138B, 142B, 146B.

Trace signal coupling software 101 is operable to process design database 150 to determine and evaluate signal coupling between traces within package design 124. Design database 150 includes parameters (e.g., a netlist) to ensure that signal nets 134A, 130B have appropriate start and end points (i.e., that signal net 134A has start and end points 132A, 134A, respectively, and that signal net 130B has start and end points 132B, 134B, respectively). A designer can manipulate design database 150 to develop the desired package design 124. As a matter of design choice, trace signal coupling software 101 may be combined with CAD software 112.

CAD software 112 processes design database 150 and utilizes design rules 152 to generate one or more Design Rule Checks (DRCs) 154 in the event that a design element or signal net of package design 124 exceeds a manufacturing constraint or electrical specification. One DRC 154A is illustratively shown in model 124A, FIG. 5, for example illustrating non-manufacturability of trace 136A. A DRC 154 may also be a textual indicator, for example a statement written to a report 157, described below. Illustratively, such a textual DRC 154 may for example state: DRC 154A=trace 136A violates physical constraint of 20 μm.

Figure 8A:
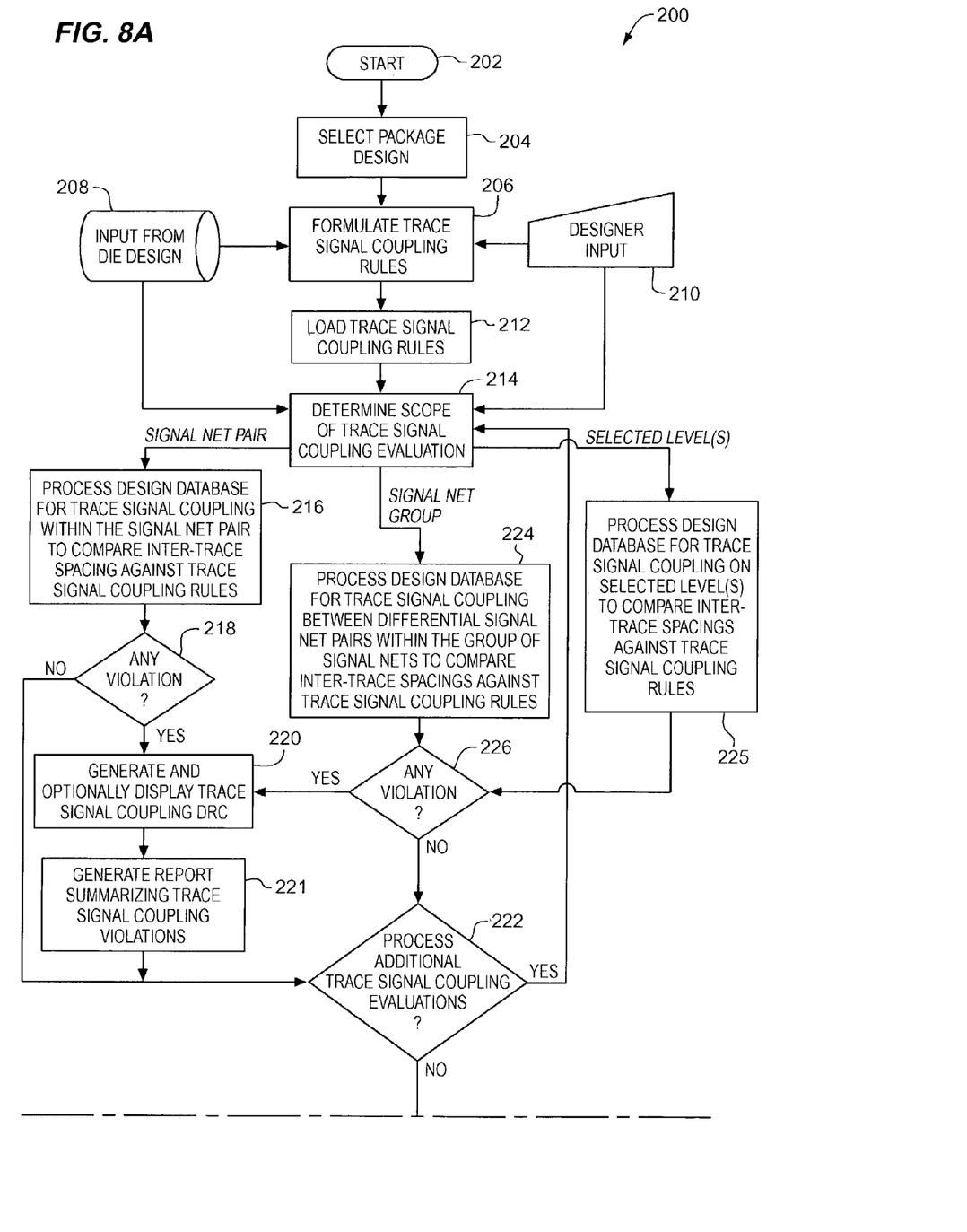
FIG. 8A and FIG. 8B show a flowchart illustrating one method for processing a package design to evaluate signal coupling between traces.
Figure 8B:
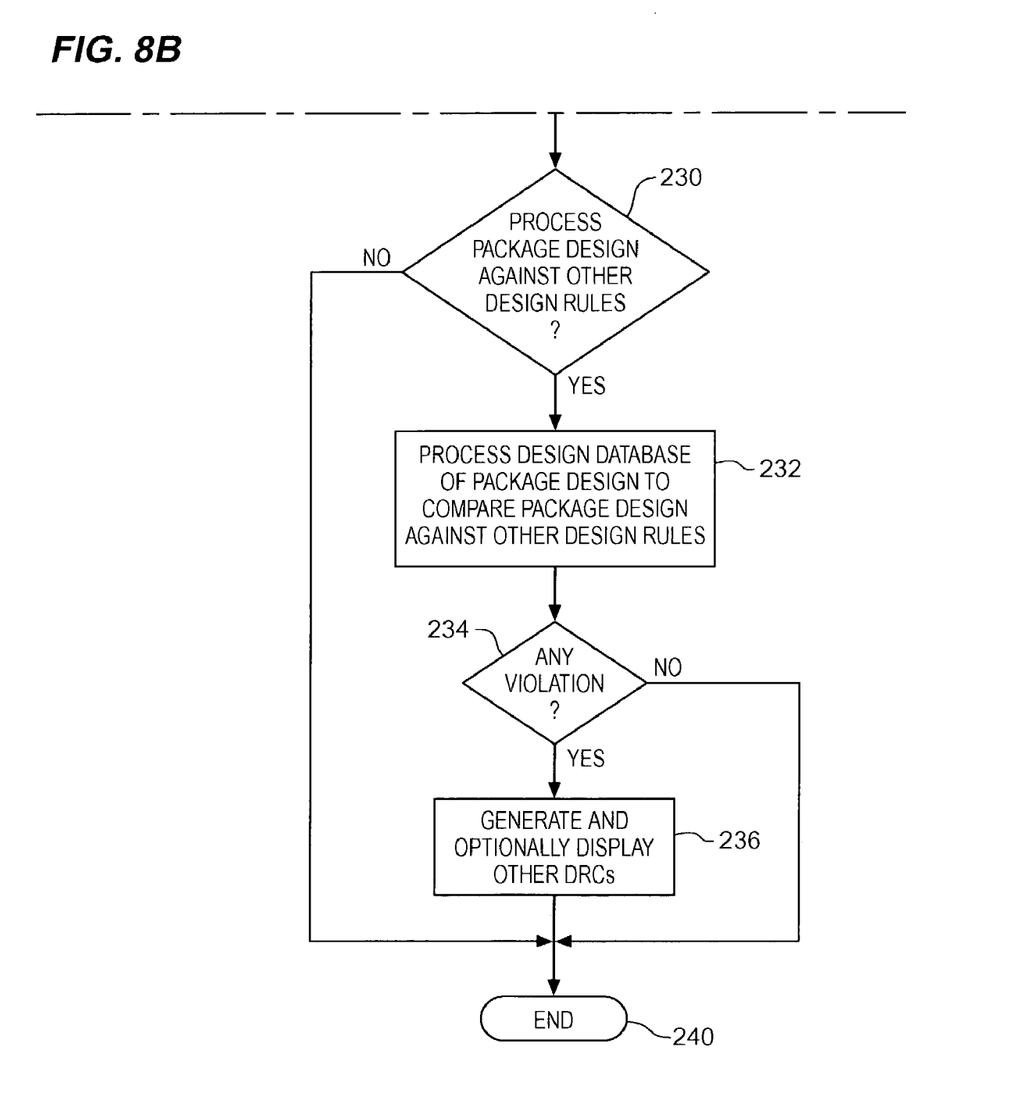

Trace signal coupling software 101 processes design database 150 and utilizes trace signal coupling rules 153 to generate one or more trace signal coupling Design Rule Checks (DRCs) 155. One DRC 155A is illustratively shown in FIG. 5, indicating a violation of trace signal coupling rules 153. DRC 155A for example illustrates that spacing Y(1:3) between trace segments 136B(4) and 136A(2) is not allowed (or out of tolerance) according to trace signal coupling rules 153. All violations of trace signal coupling rules 153 may be summarized in a report 157 managed by trace signal coupling software 101, as shown. FIG. 8A and FIG. 8B describe the operation of system 100 in its generation and utilization of trace signal coupling rules 153 and DRCs 155.

Illustratively, a representative trace signal coupling rule may be stated textually as follows: for each pair of differential signal traces in a level, the spacing between the traces shall be no more than 400 μm to ensure differential signal coupling; during a region of decoupling, the respective trace lengths of the pair shall not differ by more than 600 μm. This illustrative rule ensures that each signal net pair used in differential coupling has an appropriate spacing between its traces to maintain coupling, even if a short period of decoupling occurs. Another illustrative rule may be stated textually as follows: traces of a signal net pair carrying differential signals shall not separate by more than 120 μm to sustain differential signal coupling.

A DRC 155 may also be a textual indicator, for example a statement written to report 157. Illustratively, such a textual DRC 155 may for example state: DRC 155A=trace segments 144A(1), 144B(1) of signal net pair 134A, 130B are separated by 180 μm (i.e., Y(3:1)=180 μm) which exceeds the allowed trace coupling spacing of 120 μm.

Figure 6:
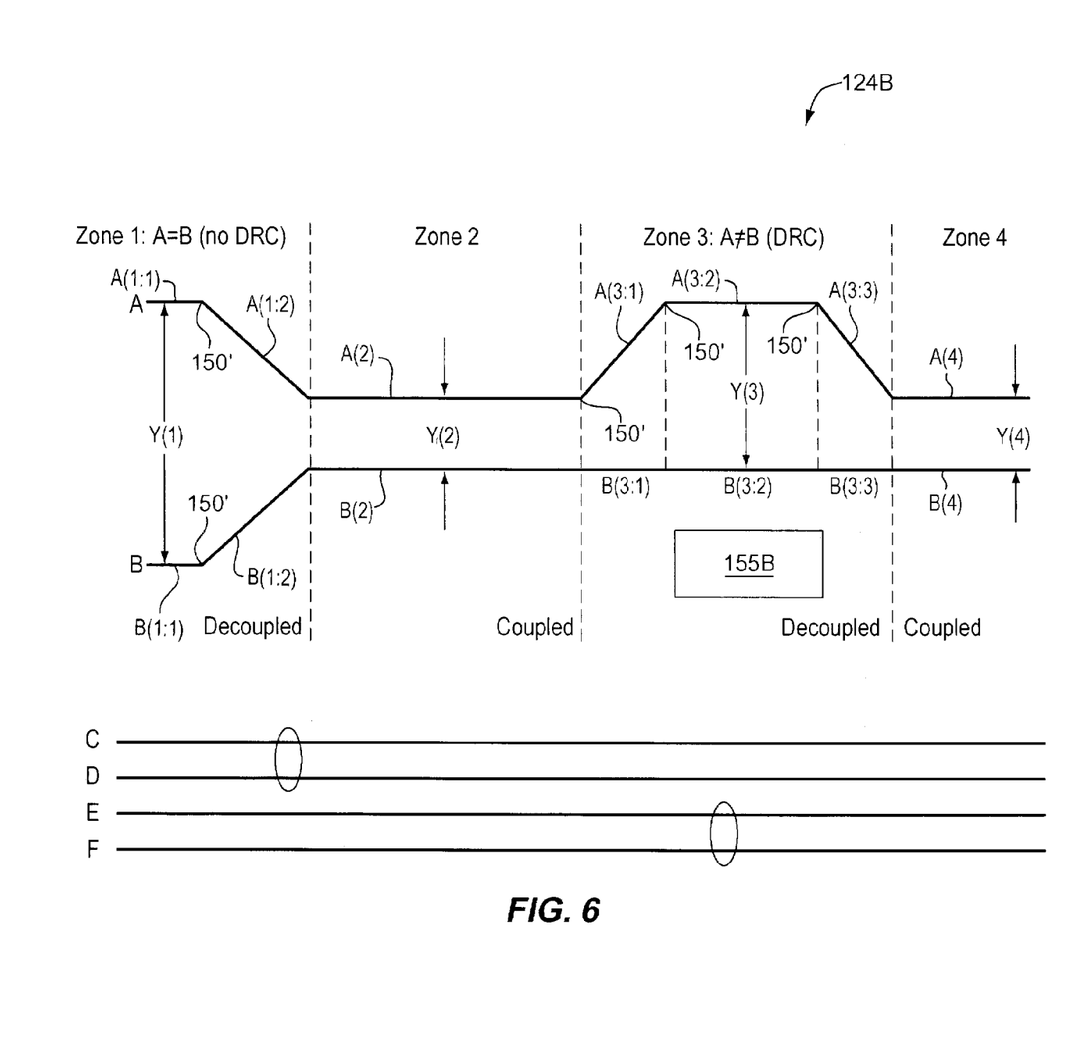
FIG. 6 schematically illustrates another package design processed by the system of FIG. 4, illustrating coupling and decoupling within one trace pair on one level of the package design.

FIG. 6 schematically illustrates a single trace pair A, B within one level one package design 124B processed by trace signal coupling software 101, FIG. 4. Traces A, B couple differential signals within the level. Illustratively, trace pair A/B is separated into four zones 1–4. Zone 2 and zone 4 represent coupled regions; zones 1 and zone 3 represent decoupled regions. More particularly, in, zone 2, trace segments A(2) and B(2) are separated by a distance Y(2) that supports differential signal coupling; for example Y(2) is 120 μm. In zone 4, similarly, trace segments A(4) and B(4) are separated by a distance Y(4) that supports differential signal coupling; for example Y(4) is also 120 μm. In zone 1, the spacing Y(1) between trace segments A(1) and B(1) (and specifically between segments A(1:1) and B(1:1)) exceeds a critical threshold, e.g., 400 μm, causing decoupling of the differential signals. However, trace segments A(1:1) and B(1:1), and A(1:2) and B(1:2), illustratively have identical lengths, and thus zone 1 does not prohibit recoupling of the differential signals in zone 2, for example.

Zone 3 adds complication to the evaluation of whether traces A, B remain coupled after zone 3. Trace segment B(3) is illustratively segmented into three sub-segments B(3:1)–B(3:3) for purposes of illustration, even through B(3) is a single straight trace. Trace segment A(3) however segments into three trace segments A(3:1)–A(3:3), due to trace deviations 150'. Trace segments A(3:2) and B(3:2) are separated by a distance Y(3) that does not support differential signal coupling; for example Y(3) exceeds 400 μm. Once decoupling in zone 3 is established, the trace segment length of one trace (e.g., A) is evaluated, in zone 3, against the trace segment length of the other trace (e.g., B), in zone 3, to determine whether coupling is sustainable after zone 3. Specifically, the length of segments A(3:1)+A(3:2)+A(3:3) is compared to the length of segment B(3) (or B(3:1)+B(3:2)+B(3:3)); if the difference between these two lengths exceeds, for,example, 600 μm, recoupling cannot satisfactorily occur in zone 4. In one embodiment, trace signal coupling software 101, FIG. 4, also counts the number of times that differential traces A and B are decoupled and recoupled when there is a difference between trace segment lengths in the zone of decoupling (e.g., this number does not necessarily change for zone 1 since the trace segment lengths of both traces A, B is equal; this number does change for zone 3 since respective trace segment lengths do differ). Trace signal coupling software 101 may thereby apply a designer guideline that limits the number of unequal trace segment lengths in zones of decoupling for a given differential trace pair.

As described in more detail below, trace signal coupling software 101, FIG. 4, is operable to determine whether the signal coupling between traces A, B meets designer guidelines set forth in trace signal coupling rules 153. Trace signal coupling software 101 in one embodiment locates zones of decoupling by isolating Y dimensions which exceeds a specified rule dimension (e.g., 120 μm or 400 μm); it then evaluates the length of trace segments in the zone of decoupling to determine if a violation of the trace signal coupling rules occurs. If there is a violation of the trace signal coupling rules 153, a trace signal coupling DRC 155B may be created to warn the designer of the offending trace pair.

FIG. 6 also shows additional traces C, D, F, G in design 124B that may also be processed by trace signal coupling software 101, to evaluate the spacing and coupling between signal net pairs carrying differential signals. Traces C, D illustrate a first signal net pair carrying differential signals of design 124; and traces E, F illustrate a second signal net pair carrying differential signals of design 124.

Figure 7:
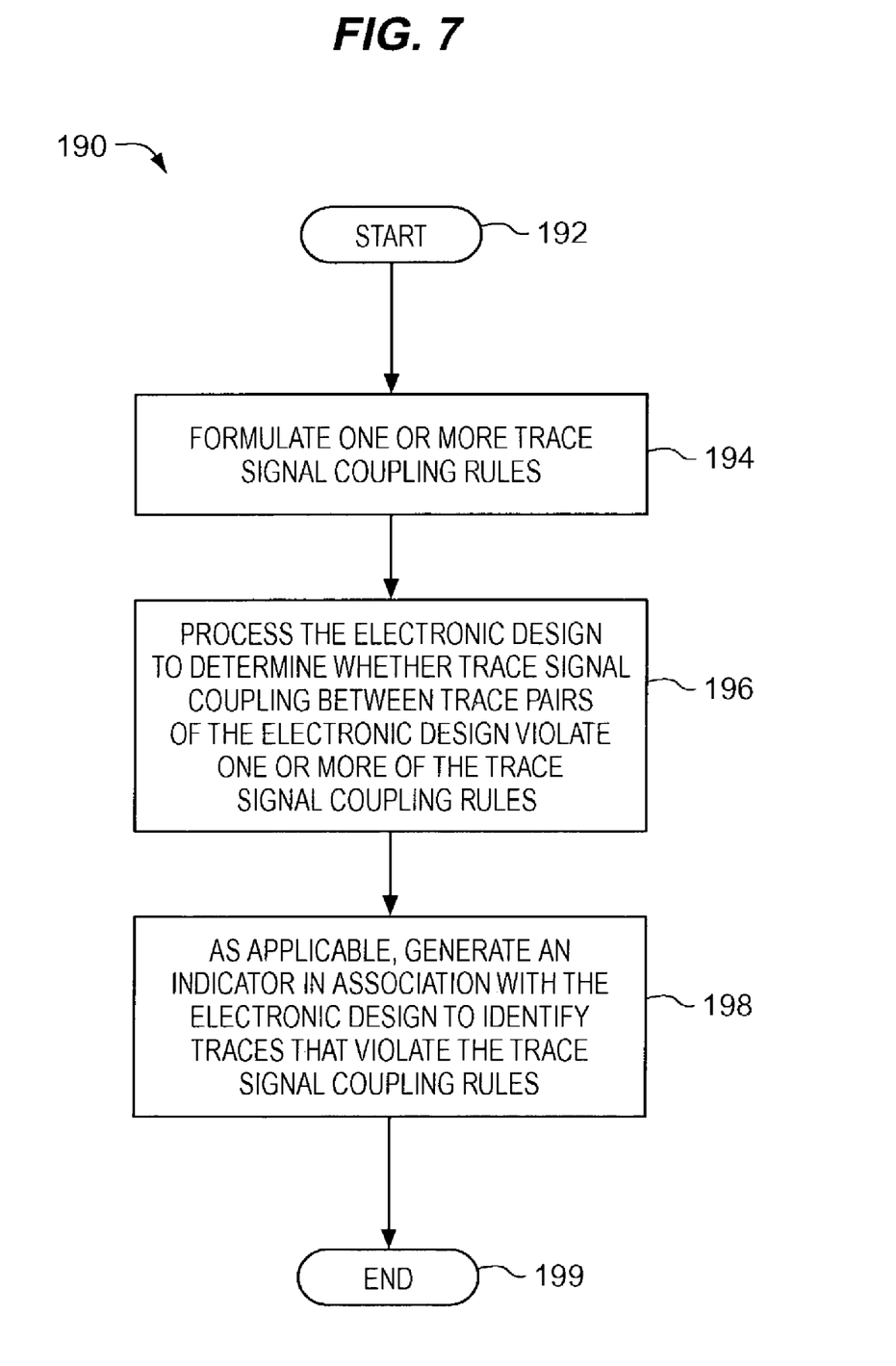
FIG. 7 is a flowchart illustrating one process for evaluating signal coupling between differential traces in an electronic design.

FIG. 7 is a flowchart illustrating one process 190 for evaluating signal coupling between differential traces in an electronic design. After start 192, one or more trace signal coupling rules are formulated, in step 194. In step 196, the electronic design is processed to determine whether trace signal coupling between trace pairs of the electronic design violate one or more of the trace signal coupling rules. In step 198, an indicator (e.g., a trace signal coupling DRC) is generated in association with the electronic design to identify traces that violate the trace signal coupling rules, if any. Process 190 terminates at 199.

As described in FIG. 8A an FIG. 8B, system 100 of FIG. 4 may generate any number of trace signal coupling DRCs 155 when a trace pair used to carry differential signals violates trace signal coupling rules 153. Trace signal coupling rules 153 may operate on one or a plurality of relationships between multiple signal nets 130 or levels, as described in FIG. 8A and FIG. 8B.

More particularly, FIG. 8A and FIG. 8B show a flowchart illustrating one process 200 for generating and utilizing trace signal coupling rules (e.g., rules 153) and trace signal coupling DRCs (e.g., DRCs 155) with respect to a package design (e.g., design 124). System 100 of FIG. 4 for example utilizes process 200 to generate DRC 154A and DRC 155A in FIG. 5.

After start 202, a package design is selected in step 204; by way of example, step 204 may automatically select a current package design 124 being created by CAD software 112.

At step 206, trace signal coupling rules are created. Process 200 shows two exemplary techniques for creating trace signal coupling rules. In one example, trace signal coupling rules are formulated 206 by processing input specifications of the die which couples with the package design, as indicated by direct data input 208. In another example, a designer manually formulates 206 trace signal coupling rules, as indicated by designer input 210. The formulated trace signal coupling rules are loaded to computer memory (e.g., memory 122, FIG. 4) in step 212, so that the trace signal coupling rules may operate with the package design selected in step 204. Trace signal coupling software 101, FIG. 4, may perform or facilitate some or all of steps 206–212.

Step 214 determines the scope of subsequent trace signal coupling evaluation. Illustratively, this determination 214 may derive from direct data input 208 associated with die specifications, or from designer inputs 210. The outputs of step 214 associate with the scope determined in step 214.

In one example, a designer selects a "signal net pair" of the package design to be processed for validation against the trace signal coupling rules. Computer 114 of system 100 responds to the request to process design database 150 and evaluate dimensions between traces in the signal net pair, and over each level of the signal net, as indicated by step 216. For example, if signal net pair 134A, 130B of model 124A, FIG. 5, is selected, then all trace spacings Y(1)–Y(3) are detected, evaluated and compared against trace signal coupling rules 153.

In one example of step 216, the inter-trace spacing between the differential signal net pair 134A, 130B (and particularly between trace segments 136B(3), 136B(4), 136B(5) and 136A(2)) is evaluated to determine whether any dimension Y(1:2)–Y(1:4) exceeds 120 μm, a desired dimension to ensure signal coupling. If Y(1:3) exceeds 400 μm, then the differential signal decouples between trace segments 136B(4) and 136A(2). A similar decoupling can also occur between trace segments 136B(3) and 136A(2) and between 136B(5) and 136A(2). Once decoupling is established, the length of the offending trace segments (i.e., trace segments 136B(3)+136B(4)+136B(5) is compared to length 162. If these lengths differ by a set value, e.g., 600 μm, in the trace coupling rules, then decoupling may not be reestablished for the signal net pair and a trace signal coupling DRC (e.g., DRC 155A) issues.

One or all dimensions used in the above analysis can incorporate tolerances. In one example, the trace signal coupling rules specify the desired 120 µm dimension to establish normal differential signal coupling. In another example, the trace signal coupling rules additionally establish a tolerance about the desired inter-trace spacing; such a tolerance is for example +/−10% or +/−20 µm. In yet another example, an inter-trace spacing of about 400 µm (+/− a tolerance, if desired) is established as a "decoupling dimension." In still another example, in a decoupling zone, when the trace segment lengths of one trace exceed the trace segment lengths of another trace by, for example, 600 µm (+/− a tolerance, if desired), a "coupling terminated" dimension is established.

Step 218 is a decision. If the signal net pair violates one or more of the trace signal coupling rules, one or more trace signal coupling DRCs 155 are generated (and optionally displayed with model 124A, for example, as DRC 155A), as indicated by step 220. Optionally, a designer may also publish a report summarizing violations of the trace signal coupling rules, as in step 221. If no violation occurs, processing continues with step 222.

In another option, from step 214, a "signal net group" of a package design is processed for validation against the trace signal coupling rules. Computer 114 of system 100 responds to the request and processes design database 150 to evaluate inter-trace spacing dimensions between traces of each differential signal net pair of the signal net group, in comparison against the trace signal coupling rules, as indicated by step 224. For example, if a signal net group is selected that includes signal net pairs A/B, C/D, E/F, FIG. 6, then computer 114 of system 100 responds to the request to process design database 150 and evaluate inter-trace spacing dimensions (e.g., .Y(1)–Y(4) between traces A/B) between signal net pairs in the signal net group, as indicated by step 224.

Step 226 is a decision. If one or more signal nets of the group violate one or more of the trace signal coupling rules, one or more trace signal coupling DRCs 155 are generated (and optionally displayed with model 124B, for example, as DRC 155B), as indicated by step 220. If no violation occurs, processing continues with step 222.

In other options, from step 214, "selected levels" of a package design are processed for validation against the trace signal coupling rules. Computer 114 of system 100 responds to the request and processes design database 150 to evaluate inter-trace spacing dimensions between each differential signal net pair of the selected level(s), in comparison against the trace signal coupling rules, as indicated by step 225. For example, if the selected levels are I(1), I(2), (3) of package 124A, FIG. 5, then computer 114 of system 100 responds to the request to process design database 150 and evaluate inter-trace spacing dimensions Y(1:1)–Y(1:4) between traces 136A and 136B of I(1), Y(2:1) between traces 140A, 140B of I(2), and Y(3:1)–Y(3:3) between traces 144A, 144B of I(3), as indicated by step 225.

Step 226 is a decision. If one or more signal net pairs of the selected level(s) violate one or more of the trace signal coupling rules, one or more trace signal coupling DRCs 155 are generated (and optionally displayed with model 124A, for example, as DRC 155A), as indicated by step 220. If no violation occurs, processing continues with step 222.

Step 222 is a decision. If additional trace signal coupling evaluations (with differing scope) are designated, step 214 repeats; otherwise, process 200 continues with step 230. Step 230 is a decision. If the package design is to be evaluated against other design rules (e.g., rules 154, FIG. 4), step 232 processes the design database relative to the other design rules. Step 234 is a decision. If other DRCs 154 exist due to violation of the other design rules, process 200 continues with step 236; otherwise process 200 ends at step 240. In step 236, one or more other DRCs (e.g., DRC 154A, FIG. 4) may be generated and optionally displayed.

The following "pseudo" code illustrates one example for evaluating trace signal coupling in a package design.

```
*Pseudo Code*
Variables:
Die_Specification :           (Structure to contain specifics for die selected)
Die_Specification_File :      (Name of file containing die specifications)
Package_Design_List :         (Structure to contain a list of all design elements of package design in the
                               design database)
Design_Element_List :             (Structure to contain a list of design elements selected from the
                                   Package_Design_List)
Design_Name :                 (Variable identifying the specific design to be validated)
Design_Rule_List :            (Structure to contain a list of design rules)
Design_Rule_Checks_List :     (Structure to contain a list of design rule violations)
    {Load Specification for the die used by the package into a list variable.}
    Die_Specification := LoadDieSpecificationFromFile(Die_Specification_File);
    {Load the package design from the package design database}
    Package_Design_List := LoadPackageDesign(Design_Name);
    {Generate die specific design rules from the die specification}
    Design_Rule_List := GenerateDesignRules(Die_Specification);
    {Add any design rules input by the designer}
    Design_Rule_List := Design_Rule_List + Input_Designer_Rules( );
    {Select all signal net pairs in the package design}
    Design_Element_List := SelectDesignElementsForChecking(Package_Design_List,
                                           Select_Signal_Net_Pairs);
    {Empty the list for storing the DRCs detected}
    Design_Rule_Check_List := EMPTY;
    {The Design_Rule_Check function tests the selected design elements against all rules in the
    Design_Rule_List, returning a DCR if the check fails. The DRC is added to the
    Design_Rule_Checks_List for later processing.}
    Design_Rule_Checks_List := Design_Rule_Check(Design_Element_List,
                                           Design_Rule_List);
```

```
IF COUNT_ITEMS_IN_LIST(Design_Rule_Checks_List) > 0 THEN
BEGIN
    {Generate a DRC report for all detected DCRs}
    Generate_Design_Rule_Check_Report(Design_Rule_Checks_List);
    IF Design_Rule_Check_Display_Selected THEN
    BEGIN
        {If the DRCs are to be displayed on screen, the
         Generate_Design_Rule_Check_Display function sends the detected DCRs for
         output on the display}
        Generate_Design_Rule_Check_Display(Design_Rule_Checks_List);
    END IF;
END IF;
```

In this example, the Design_Element_List contains a list of all signal net pair design elements. The Design_Rule_Check function steps through all design rules in the Design_Rule_List, and tests each design element in each signal net pair in the Design Element List for couplingbetween signal traces. Only pseudo code for one trace signal coupling rule is shown in the case statement for clarity. The pseudo code for the trace signal coupling rule uses a function that calculates the coupling between two trace signal elements, and allows comparison to maximum coupling levels defined in the trace signal coupling rule.

```
FUNCTION     Design_Rule_Check(Design_Element_List,Design_Rule_List) : DRC_List;
VARIABLES
Design_Rule_Index :       (Index variable used to step through Design_Rule_List)
Design_Element_Index :    (Index variable used to step through Design Element List)
DRC_List :                (List to build the Returned DRCs)
First_Net_List :          (List of design elements in first netlist of pair)
Second_Net_List :         (List of design elements in second netlist of pair)
First_Index :             (Variable index into First_Net_List)
Second_Index :            (Variable index into Second_Net_List)
BEGIN
    DRC_List := EMPTY; {Clear the return DCR list}
    {Step through the design rules in the Design Rule List and check each design element in the
     Design Element List to which the rule applies. Accumulate DRCs in the DRC_List to be
     returned at the end of the function.}
    FOR Design_Rule_Index := 1 to COUNT_ITEMS_IN_LIST(Design_Rule_List) DO
    BEGIN
        CASE Design_Rule_List[Design_Rule_Index].Type OF
        ...
        Trace Signal_Coupling_Rule:
        BEGIN
            {Separate the pair of Netlists for comparison}
            First_Net_List := Select_First_Netlist(Design_Element_List);
            Second_Net_List := Select_Second_Netlist(Design_Element_List);
            {Each pair of netlists are processed until there are no more}
            REPEAT
                {Step through the first netlist a compare the coupling of elements in the second
                 netlist that are on the same level}
                FOR First_Index := 1 to COUNT_ITEMS_IN_LIST(First_Net_List) DO
                BEGIN
                    FOR Second_Index := 1 to COUNT_ITEMS_IN_LIST(Second_Net_List) DO
                    BEGIN
                        IF First_Net_List [First_Index].Level =
                            Second_Net_List [Second_Index].Level THEN
                        BEGIN
                            IF ComputeCoupling(FirstNetList[First_Index],
                                    Second_Net_List[Second_Index]) <
                                Design_Rule_List[Design_Rule_Index].Minimum THEN
                            BEGIN
                                {The Rule failed, so add the DCR to the DCR list to be returned
                                 on completion of the function}
                                DRC_List :=
                                    DRC_List +
                                    DRC(Design_Rule_List[Design_Rule_Index].Type);
                            END IF;
                        END IF;
                    END FOR;
                END FOR;
                {Get the next signal pair from the Element_Design_List and process if its not empty}
                First_Net_List := Select_First_Netlist(Design_Element_List);
                Second_Net_List := Select_Second_Netlist(Design_Element_List);
            UNTIL COUNT_ITEMS_IN_LIST(First_Net_List) = 0;
        END Trace Signal_Coupling_Rule;
```

```
    ...
    END CASE;
  END FOR;
    RETURN DRC_List; {Return the results for the Design Rule Check function}
END FUNCTION;
*End Pseudo Code*
```

Changes may be made in the above methods and systems without departing from the scope hereof. It should thus be noted that that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between

What is claimed is:

1. A method for evaluating trace signal coupling of differential signals in an electronic design, comprising the steps of:

formulating one or more trace signal coupling rules;

processing the electronic design to determine whether trace signal coupling between trace pairs for the differential signals violate the trace signal coupling rules; and generating an indicator associated with the electronic design to identify violated trace signal coupling rules.

2. A method of claim 1, the step of processing comprising the step of processing one signal net pair of the electronic design for violation of the trace signal coupling rules.

3. A method of claim 1, the electronic design comprising a package design, the step of formulating comprising the step of formulating one or more group trace signal coupling rules for a group of signal nets of the package design, wherein the step of processing comprises the step of processing the group of signal nets to determine whether inter-trace spacings between differential signal net pairs of the group violate the group trace signal coupling rules.

4. A method of claim 3, the step of generating comprising the step of generating at least one DRC for one or more violations of the group trace signal coupling rules.

5. A method of claim 1, wherein the step of formulating one or more trace signal coupling rules comprises defining an inter-trace spacing dimension to ensure signal coupling between the trace pairs, the step of processing comprising the step of determining whether the inter-trace spacing of the trace pairs differs from the inter-trace spacing dimension.

6. A method of claim 5, the inter-trace dimension comprising about 400 microns.

7. A method of claim 5, step of formulating comprising the step of defining a tolerance about the dimension.

8. A method of claim 5, wherein the step of formulating one or more trace signal coupling rules comprises defining a trace segment length difference, between trace pairs in a zone of decoupling, to ensure proper recoupling after the zone of decoupling, the step of processing comprising the step of determining whether trace segment lengths of the trace pairs, in the zone of decoupling, differs from the trace segment length difference.

9. A method of claim 8, the trace segment length difference comprising about 600 microns.

10. A method of claim 1, the step of generating an indicator comprising the step of graphically depicting a DRC on a graphical user interface illustrating the electronic design.

11. A method of claim 1, the step of processing comprising the step of determining a spacing between each of the trace pairs.

12. A method of claim 1, the electronic design comprising a package design, the trace signal coupling rules defining trace signal coupling for a group of signal nets of the package design.

13. A method of claim 1, the step of generating an indicator comprising generating a report summarizing violations of the trace signal coupling rules.

14. A method of claim 1, wherein the step of formulating one or more trace signal coupling rules comprises defining an inter-trace coupling dimension to ensure coupling between trace pairs carrying differential signals, the step of processing comprising the step of determining whether spacing between the trace pairs differs from the inter-trace coupling dimension.

15. A method of claim 14, the inter-trace coupling dimension comprising about 120 microns.

16. A method of claim 1, wherein the step of formulating one or more trace signal coupling rules comprises defining a maximum number of times (a) the trace pairs are decoupled and recoupled and (b) the trace pairs have differing trace segment lengths, the step of processing comprising the step of determining whether a number of decoupling and recoupling for the trace pairs, with differing trace segment lengths, exceeds the maximum number.

17. A method of claim 16, the maximum number comprising about five.

18. A software product comprising instructions, stored on computer-readable media, wherein the instructions, when executed by a computer, perform steps for evaluating trace signal coupling of differential signals in an electronic design, comprising:

instructions for determining inter-trace spacing between at least one trace pair for the differential signals;

instructions for comparing the spacing to one or more trace signal coupling rules; and instructions for generating an indicator associated with the electronic design to identify violations of the trace signal coupling rules.

19. The software product of claim 18, further comprising instructions for formulating one or more of the trace signal coupling rules.

20. The software product of claim 18, further comprising instructions for determining whether one signal net in a group of signal nets has any trace pairs that violate the trace signal coupling rules.

21. The software product of claim 18, further comprising instructions for generating a report summarizing violations of the trace signal coupling rules.

22. The software product of claim 18, the instructions for comparing comprising instructions for comparing the spacing to a desired inter-trace dimension set forth in the trace signal coupling rules.

23. The software product of claim 22, the instructions for comparing comprising instructions for comparing the spacing to the desired inter-trace dimension with a tolerance defined in the trace signal coupling rules.

24. The software product of claim 18, further comprising instructions for responding to designer inputs to scope the step of determining inter-trace spacing of the at least one trace pair.

25. The software product of claim 18, the instructions for comparing comprising instructions for comparing the spacing against a trace signal coupling rule defining a dimension of about 120 microns.

26. The software product of claim 18, the instructions for comparing comprising instructions for comparing the spacing against a trace signal coupling rule defining a decoupling dimension of about 400 microns.

27. The software product of claim 26, the instructions for comparing comprising instructions for comparing the trace segment lengths of the trace pair, in a zone of decoupling, against a trace signal coupling rule defining a coupling terminated dimension of about 600 microns.

28. The software product of claim 18, the instructions for comparing further comprising instructions for determining whether respective trace segment lengths of the trace pair within a zone of decoupling differs by a length exceeding a predefined trace segment length difference.

29. The software product of claim 18, the instructions for comparing further comprising instructions for determining (a) whether respective trace segment lengths of the trace pair within each zone of decoupling differs in length, and (b) whether a number of times the trace pair determined in (a) decouples and recouples exceeds a predefined number.

30. A system for evaluating trace signal coupling of differential signals in an electronic design, comprising:

means for formulating one or more trace signal coupling rules;

means for processing the electronic design to determine whether trace signal coupling between trace pairs for the differential signals violate the trace signal coupling rules; and means for generating an indicator associated with the electronic design to identify violated trace signal coupling rules.

* * * * *

UNITED STATES PATENT AND TRADEMARK OFFICE
CERTIFICATE OF CORRECTION

PATENT NO. : 7,117,464 B2  Page 1 of 1
APPLICATION NO. : 10/368837
DATED : October 3, 2006
INVENTOR(S) : Mark D. Frank et al.

It is certified that error appears in the above-identified patent and that said Letters Patent is hereby corrected as shown below:

In column 3, line 52, delete "modem" and insert -- modern --, therefor.

In column 7, line 17, delete "134A" and insert -- 130A --, therefor.

In column 7, line 22, delete "134A" and insert -- 130A --, therefor.

In column 7, line 67, delete "134A" and insert -- 130A --, therefor.

In column 8, line 10, delete "134A" and insert -- 130A --, therefor.

In column 8, line 11, delete "134A" and insert -- 130A --, therefor.

In column 8, line 58, delete "134A" and insert -- 130A --, therefor.

In column 10, line 50, delete "134A" and insert -- 130A --, therefor.

In column 10, line 55, delete "134A" and insert -- 130A --, therefor.

Signed and Sealed this

Sixteenth Day of December, 2008

JON W. DUDAS
*Director of the United States Patent and Trademark Office*